US012562125B2

(12) United States Patent
Lee et al.

(10) Patent No.: US 12,562,125 B2
(45) Date of Patent: Feb. 24, 2026

(54) DISPLAY PANEL AND METHOD OF DRIVING THE SAME

(71) Applicant: Samsung Display Co., LTD., Yongin-si (KR)

(72) Inventors: Arong Lee, Yongin-si (KR); Kyongsub Kim, Yongin-si (KR); Donghoon Kwak, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/959,015

(22) Filed: Nov. 25, 2024

(65) Prior Publication Data

US 2025/0218384 A1 Jul. 3, 2025

(30) Foreign Application Priority Data

Jan. 2, 2024 (KR) ........................ 10-2024-0000348

(51) Int. Cl.
*G09G 3/32* (2016.01)
*G09G 3/3258* (2016.01)
*H10K 50/115* (2023.01)
*H10K 59/121* (2023.01)

(52) U.S. Cl.
CPC ......... *G09G 3/3258* (2013.01); *H10K 50/115* (2023.02); *H10K 59/1213* (2023.02); *H10K 59/1216* (2023.02); *G09G 2310/08* (2013.01); *G09G 2320/0257* (2013.01)

(58) Field of Classification Search
CPC ............. G09G 3/3258; G09G 2310/08; G09G 2320/0257; G09G 3/3233; G09G 3/32; G09G 2300/0426; G09G 2300/0852; G09G 2320/043; H10K 50/115; H10K 59/1213; H10K 59/1216; H10H 20/822; H10H 29/142
See application file for complete search history.

(56) References Cited

U.S. PATENT DOCUMENTS

| | | | | |
|---|---|---|---|---|
| 2014/0368481 A1* | 12/2014 | Tomikawa | ............ | G02F 1/1339 345/96 |
| 2016/0315452 A1* | 10/2016 | Chen | ...................... | H01S 5/1032 |
| 2017/0061909 A1* | 3/2017 | Chung | ................. | G09G 3/3677 |
| 2024/0168327 A1* | 5/2024 | Shimoshikiryoh | ... | G02F 1/1335 |

FOREIGN PATENT DOCUMENTS

| | | |
|---|---|---|
| EP | 2638321 B1 | 5/2019 |
| KR | 1020210085513 A | 7/2021 |
| KR | 1020230082773 A | 6/2023 |

* cited by examiner

*Primary Examiner* — Pegeman Karimi
(74) *Attorney, Agent, or Firm* — CANTOR COLBURN LLP

(57) ABSTRACT

A display panel includes a pixel including a quantum dot light-emitting diode. A first power and a second power are applied to the pixel. One of the first power and the second power is an alternating-current power and a remaining one of the first power and the second power is a direct-current power. The alternating-current power which is the one of the first power and the second power has three different voltage levels.

20 Claims, 13 Drawing Sheets

FIG. 1

PER1 : P1+P2+P3+P4+P5

PER1 : P1+P2+P3+P4+P5

PER1:P1+P2+P3+P4+P5

PER1:P1+P2+P3+P4+P5

DISPLAY PANEL AND METHOD OF DRIVING THE SAME

This application claims priority to Korean Patent Application No. 10-2024-0000348, filed on Jan. 2, 2024, and all the benefits accruing therefrom under 35 U.S.C. § 119, the content of which in its entirety is herein incorporated by reference.

BACKGROUND

1. Field

Embodiments of the inventive concept relate to a display panel and a method of driving the display panel. More particularly, embodiments of the inventive concept relate to a display panel removing a trap in a quantum dot light-emitting diode by alternating-current driving either a first power or a second power which are applied to a pixel.

2. Description of the Related Art

Generally, a display apparatus includes a display panel and a display panel driver. The display panel includes a plurality of gate lines, a plurality of data lines, a plurality of emission lines and a plurality of pixels. The display panel driver includes a gate driver, a data driver, an emission driver and a driving controller. The gate driver outputs gate signals to the gate lines. The data driver outputs data voltages to the data lines. The emission driver outputs emission signals to the emission lines. The driving controller controls the gate driver, the data driver and the emission driver.

SUMMARY

When the display panel includes a quantum dot light-emitting diode, a hole is trapped at a relatively high energy level or an electron is trapped at a relatively low energy level in a light-emitting layer of the quantum dot light-emitting diode. Accordingly, when the hole and the electron combine with each other, the hole and the electron may not contribute to light emission. This is referred to as a trap and the trap may cause an afterimage stain and reduce a lifespan.

Embodiments of the inventive concept provide a display panel enhancing a display quality and enhancing a lifespan of a quantum dot light-emitting diode.

Embodiments of the inventive concept also provide a method of driving the display panel.

In an embodiment of a display panel according to the inventive concept, the display panel includes a pixel including a quantum dot light-emitting diode. A first power and a second power are applied to the pixel. One of the first power and the second power is an alternating-current power and a remaining one of the first power and the second power is a direct-current power. The alternating-current power which is the one of the first power and the second power has three different voltage levels.

In an embodiment, the first power may be the alternating-current power. The first power may have a first voltage, a second voltage lower than the first voltage and a third voltage lower than the second voltage.

In an embodiment, the second power may be the direct-current power. The second power may have the second voltage.

In an embodiment, the first power may have a periodicity of a first period. A second off duration when the first power has the third voltage may be longer than a first off duration when the first power has the second voltage in the first period.

In an embodiment, the first power may have the second voltage in a first duration. The first power may have the first voltage in a second duration subsequent to the first duration. The first power may have the third voltage in a third duration subsequent to the second duration. The first power may have the first voltage in a fourth duration subsequent to the third duration. The first power may have the second voltage in a fifth duration subsequent to the fourth duration.

In an embodiment, a length of the third duration may be longer than a sum of a length of the first duration and a length of the fifth duration.

In an embodiment, the first power may have the third voltage in a first duration. The first power may have the first voltage in a second duration subsequent to the first duration. The first power may have the second voltage in a third duration subsequent to the second duration. The first power may have the first voltage in a fourth duration subsequent to the third duration. The first power may have the third voltage in a fifth duration subsequent to the fourth duration.

In an embodiment, a sum of a length of the first duration and a length of the fifth duration may be longer than a length of the third duration.

In an embodiment, the second power may be the alternating-current power. The second power may have a first voltage, a second voltage higher than the first voltage and a third voltage higher than the second voltage.

In an embodiment, the first power may be the direct-current power. The first power may have the second voltage.

In an embodiment, the second power may have a periodicity of a first period. A second off duration when the second power has the third voltage may be longer than a first off duration when the second power has the second voltage in the first period.

In an embodiment, the second power may have the second voltage in a first duration. The second power may have the first voltage in a second duration subsequent to the first duration. The second power may have the third voltage in a third duration subsequent to the second duration. The second power may have the first voltage in a fourth duration subsequent to the third duration. The second power may have the second voltage in a fifth duration subsequent to the fourth duration.

In an embodiment, the second power may have the third voltage in a first duration. The second power may have the first voltage in a second duration subsequent to the first duration. The second power may have the second voltage in a third duration subsequent to the second duration. The second power may have the first voltage in a fourth duration subsequent to the third duration. The second power may have the third voltage in a fifth duration subsequent to the fourth duration.

In an embodiment, the alternating-current power may have a periodicity of a first period. One period of the first period may be disposed in a single driving frame of the display panel.

In an embodiment, the alternating-current power may have a periodicity of a first period. A plurality of sub-periods of the first period may be disposed in a single driving frame of the display panel.

In an embodiment, the first power may be the alternating-current power. The first power may have a first voltage, a second voltage lower than the first voltage and a third voltage lower than the second voltage. The first power may have the second voltage in a first duration. The first power may have the first voltage in a second duration subsequent to the first duration. The first power may have the third voltage in a third duration subsequent to the second duration. The first power may have the first voltage in a fourth duration subsequent to the third duration. The first power may have the second voltage in a fifth duration subsequent to the fourth duration. The first power may have the second voltage in a sixth duration subsequent to the fifth duration. The first power may have the first voltage in a seventh duration subsequent to the sixth duration. The first power may have the third voltage in an eighth duration subsequent to the seventh duration. The first power may have the first voltage in a ninth duration subsequent to the eighth duration. The first power may have the second voltage in a tenth duration subsequent to the ninth duration.

In an embodiment, the pixel may include a first pixel switching element including a control electrode connected to a first node, a first electrode connected to a second node and a second electrode connected to a third node, a second pixel switching element including a control electrode which receives a data writing gate signal, a first electrode which receives a data voltage and a second electrode connected to the second node, a third pixel switching element including a control electrode which receives the data writing gate signal, a first electrode connected to the first node and a second electrode connected to the third node, a fourth pixel switching element including a control electrode which receives a data initialization gate signal, a first electrode which receives an initialization voltage and a second electrode connected to the first node, a fifth pixel switching element including a control electrode which receives an emission signal, a first electrode which receives the first power and a second electrode connected to the second node, a sixth pixel switching element including a control electrode which receives the emission signal, a first electrode connected to the third node and a second electrode connected to an anode electrode of the quantum dot light-emitting diode and a seventh pixel switching element including a control electrode which receives a light-emitting diode initialization gate signal, a first electrode which receives a light-emitting diode initialization voltage and a second electrode connected to the anode electrode of the quantum dot light-emitting diode. The second power may be applied to a cathode electrode of the quantum dot light-emitting diode.

In an embodiment, the third pixel switching element may include a 3-1 transistor and a 3-2 transistor connected to each other in series. The fourth pixel switching element may include a 4-1 transistor and a 4-2 transistor connected to each other in series. The pixel may further include a first capacitor including a first electrode which receives the first power and a second electrode connected to the first node, a second capacitor including a first electrode which receives the first power and a second electrode connected to a first intermediate node between the 3-1 transistor and the 3-2 transistor and a third capacitor including a first electrode which receives the first power and a second electrode connected to a second intermediate node between the 4-1 transistor and the 4-2 transistor.

In an embodiment, the quantum dot light-emitting diode may include a hole injection layer, a hole transporting layer adjacent to the hole injection layer, a light-emitting layer adjacent to the hole transporting layer and an electron transporting layer adjacent to the light-emitting layer. The hole injection layer and the hole transporting layer may include an organic material. The light-emitting layer and the electron transporting layer may include an inorganic material. The light-emitting layer may include a quantum dot.

In an embodiment of a method of driving a display panel, the method includes applying a first power to a pixel including a quantum dot light-emitting diode and applying a second power to the pixel. One of the first power and the second power is an alternating-current power and a remaining one of the first power and the second power is a direct-current power. The alternating-current power which is the one of the first power and the second power has three different voltage levels.

According to the display panel and the method of driving the display panel, one of the first power and the second power which are applied to the pixel may be driven by alternating-current and a remaining one of the first power and the second power may be driven by direct-current. When the first power is driven by alternating-current, the first power may include a first voltage, a second voltage lower than the first voltage and a third voltage lower than the second voltage. When the second power is driven by alternating-current, the second power may include a first voltage, a second voltage higher than the first voltage and a third voltage higher than the second voltage. When the first power has the third voltage and the second power has the third voltage, the trapped charge of the light-emitting layer of the quantum dot light-emitting diode may be removed. Thus, the afterimage stain of the display panel may be prevented and the lifespan of the quantum dot light-emitting diode may be enhanced.

BRIEF DESCRIPTION OF THE DRAWINGS

The above and other features and advantages of the inventive concept will become more apparent by describing in detailed embodiments thereof with reference to the accompanying drawings, in which:

FIG. 1 is a block diagram illustrating an embodiment of a display apparatus according to the inventive concept;

DETAILED DESCRIPTION OF THE INVENTIVE CONCEPT

Figure 2:
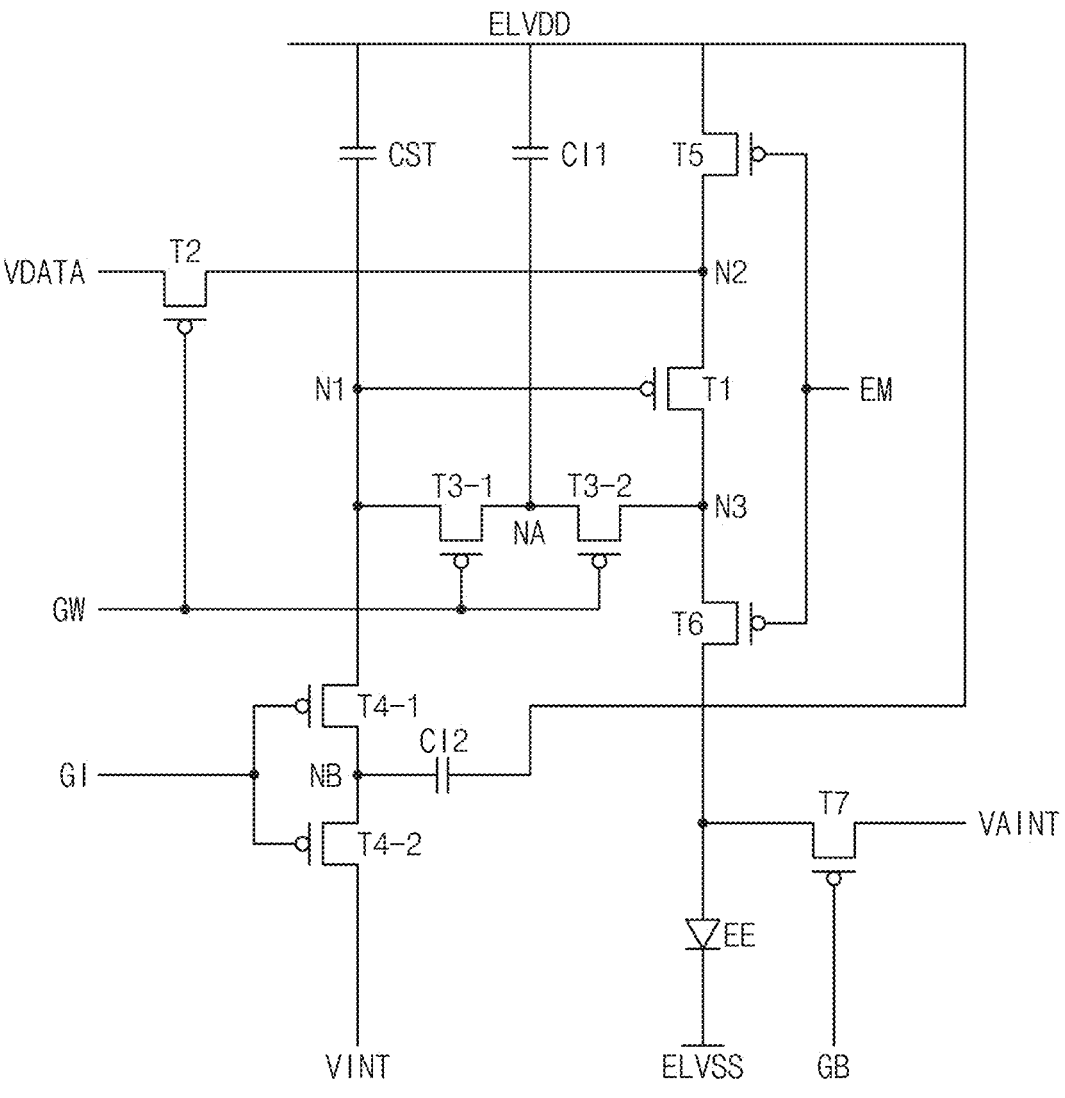
FIG. 2 is a circuit diagram illustrating an embodiment of a pixel of a display panel of FIG. 1.

Hereinafter, the inventive concept will be explained in detail with reference to the accompanying drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
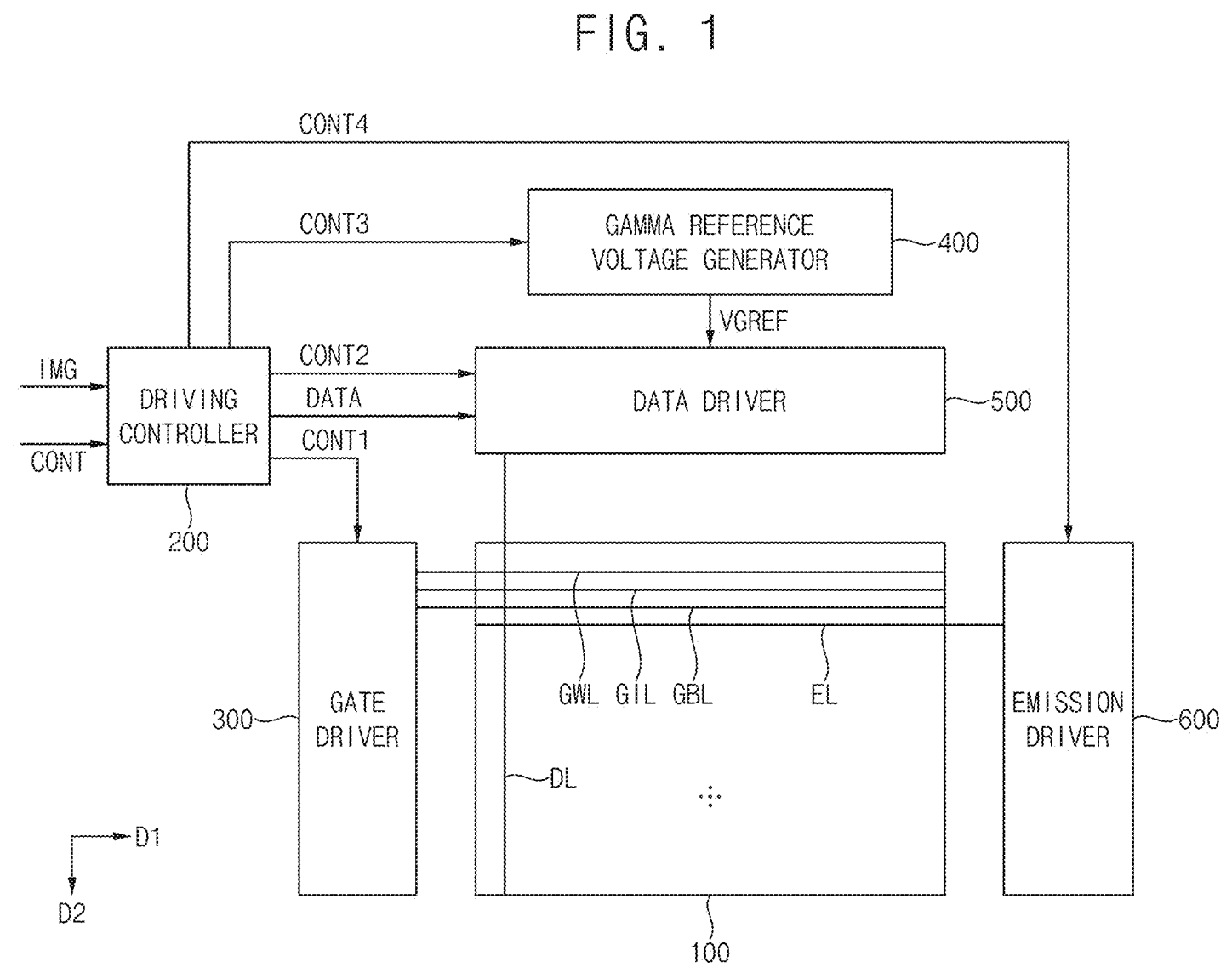

FIG. 1 is a block diagram illustrating an embodiment of a display apparatus according to the inventive concept.

Referring to FIG. 1, the display apparatus includes a display panel 100 and a display panel driver. The display panel driver includes a driving controller 200, a gate driver 300, a gamma reference voltage generator 400, a data driver 500 and an emission driver 600.

The display panel 100 has a display region on which an image is displayed and a peripheral region adjacent to the display region.

The display panel 100 includes a plurality of gate lines GWL, GIL and GBL, a plurality of data lines DL, a plurality of emission lines EL and a plurality of pixels electrically connected to the gate lines GWL, GIL and GBL, the data lines DL and the emission lines EL. The gate lines GWL, GIL and GBL extend in a first direction D1, the data lines DL extend in a second direction D2 crossing the first direction D1 and the emission lines EL extend in the first direction D1.

The driving controller 200 receives input image data IMG and an input control signal CONT from an external apparatus (e.g., an application processor). In an embodiment, the input image data IMG may include red image data, green image data and blue image data. The input image data IMG may include white image data, for example. The input image data IMG may include magenta image data, cyan image data and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals driving the gate lines GWL, GIL and GBL in response to the first control signal CONT1 received from the driving controller 200. The gate driver 300 may sequentially output the gate signals to the gate lines GWL, GIL and GBL. In an embodiment, the gate driver 300 may be integrated on the display panel 100, for example. In an embodiment, the gate driver 300 may be disposed (e.g., mounted) on the display panel 100, for example.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an embodiment, the gamma reference voltage generator 400 may be disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The emission driver 600 generates emission signals to drive the emission lines EL in response to the fourth control signal CONT4 received from the driving controller 200. The emission driver 600 may output the emission signals to the emission lines EL.

In an embodiment of the inventive concept, the emission driver 600 may be integrated on the peripheral region of the display panel 100. In an embodiment of the inventive concept, the emission driver 600 may be disposed (e.g., mounted) on the peripheral region of the display panel 100.

Although the gate driver 300 is illustrated to be disposed at a first side (e.g., left side) of the display panel 100 and the emission driver 600 is illustrated to be disposed at a second side (e.g., right side) of the display panel 100 opposite to the first side in FIG. 1 for convenience of explanation, the inventive concept may not be limited thereto. In an embodiment, both of the gate driver 300 and the emission driver 600 may be disposed at the first side of the display panel 100, for example. In an embodiment, both of the gate driver 300 and the emission driver 600 may be disposed at opposite sides of the display panel 100, for example. In an embodiment, the gate driver 300 and the emission driver 600 may be unitary, for example.

The display panel driver may further include a power voltage driver outputting a first power and a second power which are applied to the pixel of the display panel 100.

FIG. 2 is a circuit diagram illustrating an embodiment of the pixel of the display panel 100 of FIG. 1.

Referring to FIGS. 1 and 2, the display panel 100 includes the plurality of the pixels. Each pixel includes a light-emitting element EE. In the illustrated embodiment, the light-emitting element EE may be a quantum dot light-emitting diode EE.

The pixels receive a data writing gate signal GW, a data initialization gate signal GI, a light-emitting diode initialization gate signal GB, the data voltage VDATA and the emission signal EM and the quantum dot light-emitting diodes EE of the pixels emit light corresponding to the level of the data voltage VDATA to display the image.

At least one of the pixels may include first to seventh pixel switching elements T1 to T7 and the quantum dot light-emitting diode EE. At least one of the pixels may further include a first capacitor CST, a second capacitor CI1 and a third capacitor CI2.

The first pixel switching element T1 may include a control electrode connected to a first node N1, a first electrode connected to a second node N2 and a second electrode connected to a third node N3.

The second pixel switching element T2 may include a control electrode receiving the data writing gate signal GW, a first electrode receiving the data voltage VDATA and a second electrode connected to the second node N2.

The third pixel switching element T3-1 and T3-2 may include a control electrode receiving the data writing gate signal GW, a first electrode connected to the first node N1 and a second electrode connected to the third node N3. The third pixel switching element T3-1 and T3-2 may include a 3-1 transistor T3-1 and a 3-2 transistor T3-2 connected to each other in series. When the third pixel switching element T3-1 and T3-2 includes the 3-1 transistor T3-1 and the 3-2 transistor T3-2, a leakage of a signal of the first node N1 may be prevented.

The fourth pixel switching element T4-1 and T4-2 may include a control electrode receiving the data initialization gate signal GI, a first electrode receiving an initialization voltage VINT and a second electrode connected to the first node N1. The fourth pixel switching element T4-1 and T4-2 may include a 4-1 transistor T4-1 and a 4-2 transistor T4-2 connected to each other in series. When the fourth pixel switching element T4-1 and T4-2 includes the 4-1 transistor T4-1 and the 4-2 transistor T4-2, a leakage of the signal of the first node N1 may be prevented.

The fifth pixel switching element T5 may include a control electrode receiving the emission signal EM, a first electrode receiving a first power ELVDD and a second electrode connected to the second node N2.

The sixth pixel switching element T6 may include a control electrode receiving the emission signal EM, a first electrode connected to the third node N3 and a second electrode connected to an anode electrode of the quantum dot light-emitting diode EE.

The seventh pixel switching element T7 may include a control electrode receiving the light-emitting diode initialization gate signal GB, a first electrode receiving a light-emitting diode initialization voltage VAINT and a second electrode connected to the anode electrode of the quantum dot light-emitting diode EE.

In an embodiment, the first to seventh pixel switching elements T1 to T7 may be P-type thin film transistors, for example. The control electrodes of the first to seventh pixel switching elements T1 to T7 may be gate electrodes, the first electrodes of the first to seventh pixel switching elements T1 to T7 may be source electrodes and the second electrodes of the first to seventh pixel switching elements T1 to T7 may be drain electrodes. However, the disclosure is not limited thereto, and the source electrode and the drain electrode of the first to seventh pixel switching elements T1 to T7 may be switched with each other according to a type of the switching element in another embodiment.

The quantum dot light-emitting diode EE may include the anode electrode and a cathode electrode receiving a second power ELVSS.

The first capacitor CST may include a first electrode receiving the first power ELVDD and a second electrode connected to the first node N1.

The second capacitor CI1 may include a first electrode receiving the first power ELVDD and a second electrode connected to a first intermediate node NA between the 3-1 transistor T3-1 and the 3-2 transistor T3-2.

The third capacitor CI2 may include a first electrode receiving the first power ELVDD and a second electrode connected to a second intermediate node NB between the 4-1 transistor T4-1 and the 4-2 transistor T4-2.

Figure 3:
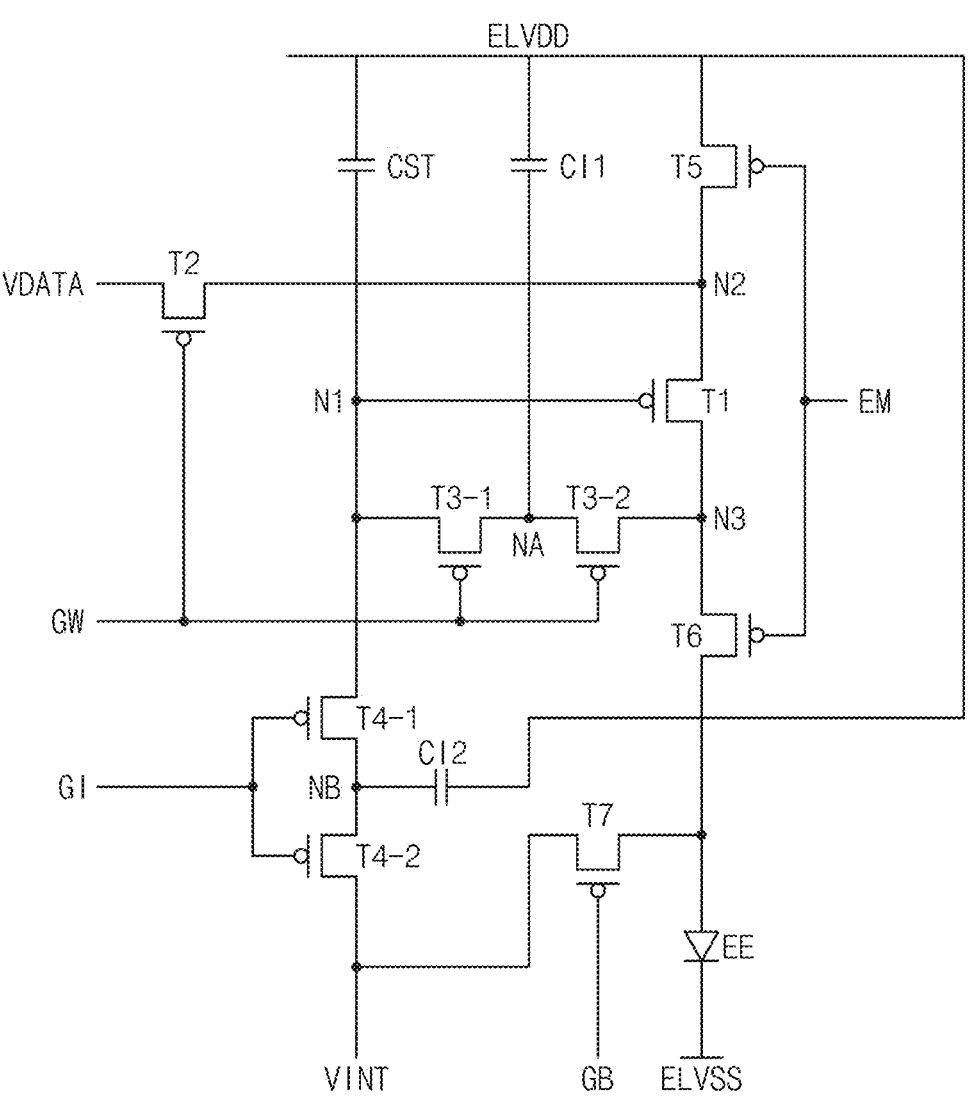
FIG. 3 is a circuit diagram illustrating an embodiment of a pixel of the display panel of FIG. 1.

FIG. 3 is a circuit diagram illustrating an embodiment of a pixel of the display panel 100 of FIG. 1.

The display panel in the illustrated embodiment is substantially the same as the display panel of FIG. 2 except that the initialization voltage is connected to the first electrode of the seventh pixel switching element. Thus, the same reference numerals will be used to refer to the same or like parts as those described in the previous embodiment of FIG. 2 and any repetitive explanation concerning the above elements will be omitted.

Referring to FIGS. 1 and 3, the seventh pixel switching element T7 may include a control electrode receiving the light-emitting diode initialization gate signal GB and a first electrode receiving the initialization voltage VINT and a second electrode connected to the anode electrode of the quantum dot light-emitting diode EE.

Figure 4:
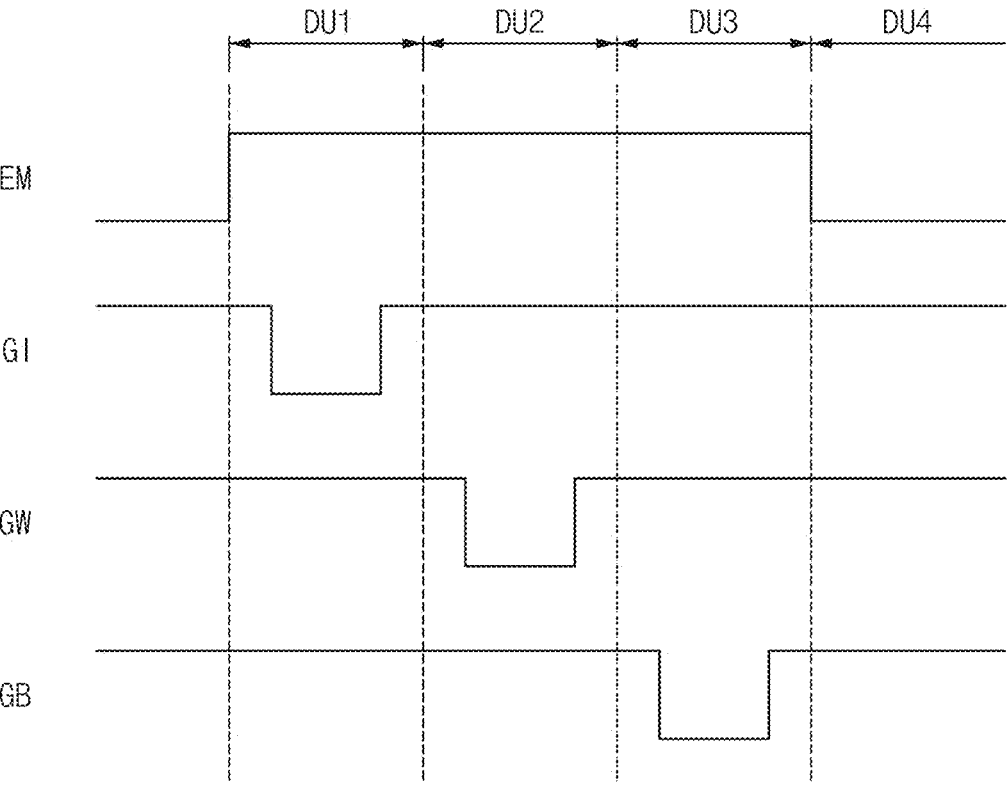
FIG. 4 is a timing diagram illustrating an embodiment of input signals applied to the pixel of FIG. 2 and the pixel of FIG. 3.

FIG. 4 is a timing diagram illustrating an embodiment of input signals applied to the pixel of FIG. 2 and the pixel of FIG. 3.

Referring to FIGS. 1 to 4, during a first pixel duration DU1, the first node N1 and the first capacitor CST are initialized in response to the data initialization gate signal GI. During a second pixel duration DU2, a threshold voltage of the first pixel switching element T1 is compensated and the data voltage VDATA of which the threshold voltage is compensated is written to the first node N1 in response to the data writing gate signal GW. During a third pixel duration DU3, the anode electrode of the quantum dot light-emitting diode EE is initialized in response to the light-emitting diode initialization gate signal GB. During a fourth pixel duration DU4, the quantum dot light-emitting diode EE emits the light in response to the emission signal EM so that the display panel 100 displays the image.

During the first pixel duration DU1, the data initialization gate signal GI may have an active level. In an embodiment, the active level of the data initialization gate signal GI may be a relatively low level, for example. When the data initialization gate signal GI has the active level, the fourth pixel switching element T4 is turned on so that the initialization voltage VINT may be applied to the first node N1. The data initialization gate signal GI of a stage may be a scan signal of a previous stage.

During the second pixel duration DU2, the data writing gate signal GW may have an active level. In an embodiment, the active level of the data writing gate signal GW may be a relatively low level, for example. When the data writing gate signal GW has the active level, the second pixel switching element T2 and the third pixel switching element T3-1 and T3-2 are turned on. In addition, the first pixel switching element T1 is turned on in response to the initialization voltage VINT. In an embodiment, the data writing gate signal GW of the stage may be a scan signal of the stage.

A voltage which is subtraction an absolute value of the threshold voltage of the first pixel switching element T1 from the data voltage VDATA may be charged at the first node N1 along a path generated by the first to third pixel switching elements T1, T2, T3-1 and T3-2.

During the third pixel duration DU3, the light-emitting diode initialization gate signal GB may have an active level. In an embodiment, the active level of the light-emitting diode initialization gate signal GB may be a relatively low level, for example. When the light-emitting diode initialization gate signal GB has the active level, the seventh pixel switching element T7 is turned on so that the initialization voltage VINT may be applied to the anode electrode of the quantum dot light-emitting diode EE. The light-emitting diode initialization gate signal GB of the stage may be a scan signal of a next stage.

During the fourth pixel duration DU4, the emission signal EM may have an active level. The active level of the emission signal EM may be a relatively low level. When the emission signal EM has the active level, the fifth pixel switching element T5 and the sixth pixel switching element T6 are turned on. In addition, the first pixel switching element T1 is turned on by the data voltage VDATA.

A driving current flows through the fifth pixel switching element T5, the first pixel switching element T1 and the sixth pixel switching element T6 to drive the quantum dot light-emitting diode EE. An intensity of the driving current may be determined by the level of the data voltage VDATA. A luminance of the quantum dot light-emitting diode EE is determined by the intensity of the driving current.

The threshold voltage is compensated during the second pixel duration DU2, so that the driving current may be determined regardless of the threshold voltage of the first pixel switching element T1 when the quantum dot light-emitting diode EE emits the light during the fourth pixel duration DU4.

Figure 5:
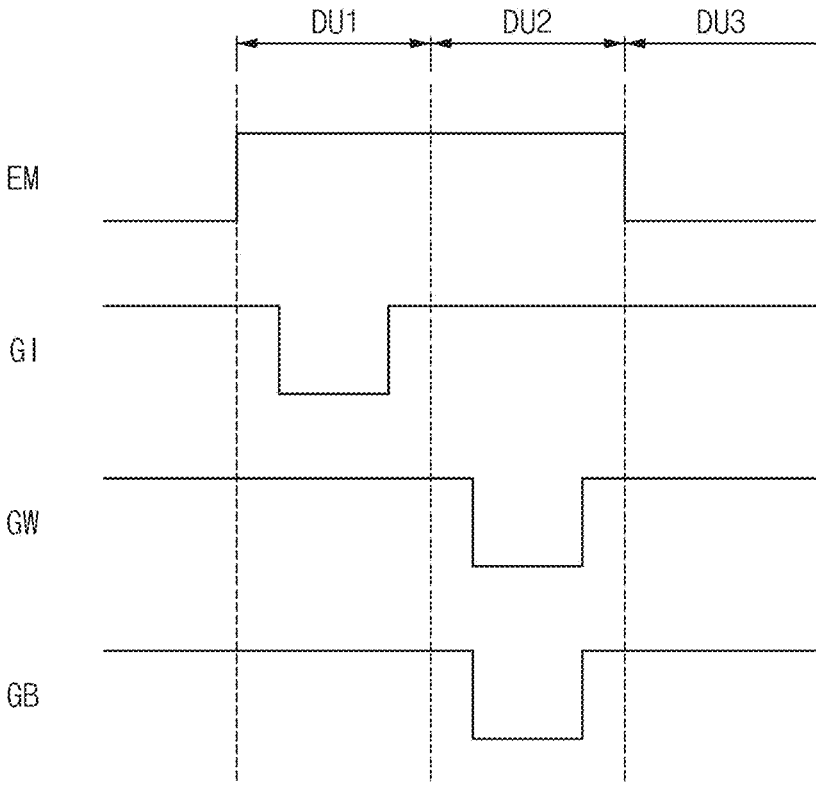
FIG. 5 is a timing diagram illustrating an embodiment of input signals applied to the pixel of FIG. 2 and the pixel of FIG. 3.

FIG. 5 is a timing diagram illustrating an embodiment of input signals applied to the pixel of FIG. 2 and the pixel of FIG. 3.

The input signals applied to the pixel of the display panel in the illustrated embodiment are substantially the same as the input signals applied to the pixel of the display panel of FIG. 4 except that the active period of the light-emitting diode initialization gate signal GB is same as the active period of the data writing gate signal GW. Thus, the same reference numerals will be used to refer to the same or like parts as those described in the previous embodiment of FIG. 4 and any repetitive explanation concerning the above elements will be omitted.

Referring to FIGS. 1, 2, 3 and 5, during a first pixel duration DU1, the first node N1 and the first capacitor CST are initialized in response to the data initialization gate signal GI. During a second pixel duration DU2, a threshold voltage of the first pixel switching element T1 is compensated and the data voltage VDATA of which the threshold voltage is compensated is written to the first node N1 in response to the data writing gate signal GW. In addition, during the second pixel duration DU2, the anode electrode of the quantum dot light-emitting diode EE is initialized in response to the light-emitting diode initialization gate signal GB. During a third pixel duration DU3, the quantum dot light-emitting diode EE emits the light in response to the emission signal EM so that the display panel 100 displays the image.

In the illustrated embodiment, the active period of the light-emitting diode initialization gate signal GB may be same as the active period of the data writing gate signal GW. In an embodiment, the control electrode of the seventh pixel switching element T7 may be connected to the control electrode of the second pixel switching element T2, for example.

Figure 6:
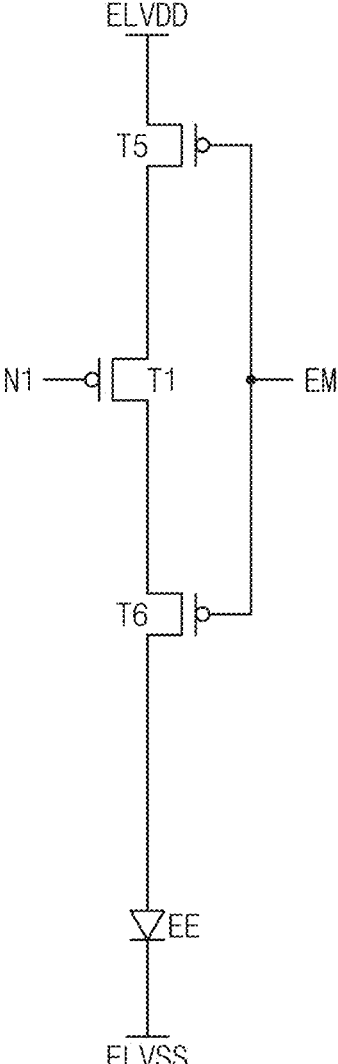
FIG. 6 is a circuit diagram illustrating a portion of the pixel of FIG. 2.

FIG. 6 is a circuit diagram illustrating a portion of the pixel of FIG. 2.

Referring to FIGS. 1 to 6, the first power ELVDD may be applied to the first electrode of the fifth pixel switching element T5, the second power ELVSS may be applied to the cathode electrode of the quantum dot light-emitting diode EE. The fifth pixel switching element T5, the first pixel switching element T1, the sixth pixel switching element T6 and the quantum dot light-emitting diode EE may be sequentially disposed between the first power ELVDD and the second power ELVSS. The pixel circuit of the illustrated embodiment may not be limited to the pixel circuit of FIG. 2 and the pixel circuit of FIG. 3, and the inventive concept may be applied to various pixels in which one or more switching elements and a quantum dot light-emitting diode EE are disposed between the first power ELVDD and the second power ELVSS as shown in FIG. 6.

Figure 7:
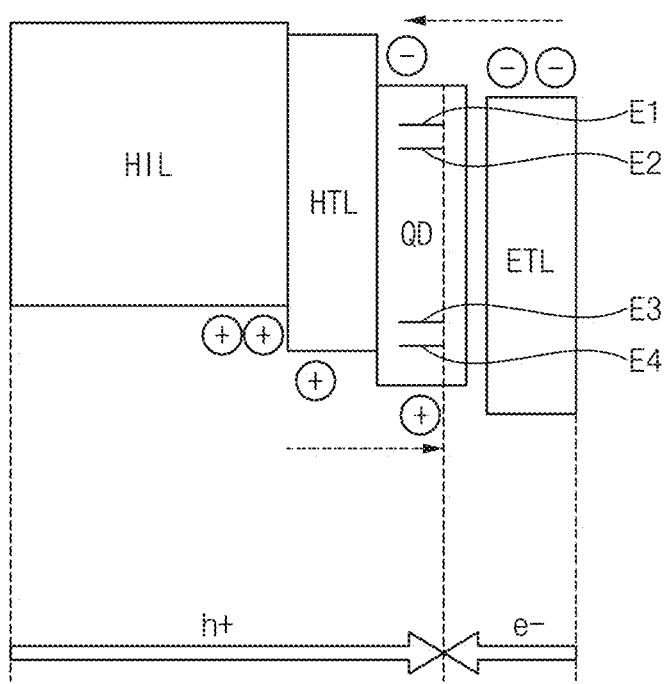
FIG. 7 is a diagram illustrating a quantum dot light-emitting diode of FIG. 6.

FIG. 7 is a diagram illustrating the quantum dot light-emitting diode EE of FIG. 6.

Referring to FIGS. 1 to 7, the quantum dot light-emitting diode EE may include a hole injection layer HIL, a hole transporting layer HTL adjacent to the hole injection layer HIL, a light-emitting layer QD adjacent to the hole transporting layer HTL and an electron transporting layer ETL adjacent to the light-emitting layer QD.

In an embodiment, the hole injection layer HIL and the hole transporting layer HTL may include an organic material. The light-emitting layer QD and the electron transporting layer ETL may include an inorganic material. In an embodiment, the light-emitting layer QD may include a quantum dot, for example.

Figure 8:
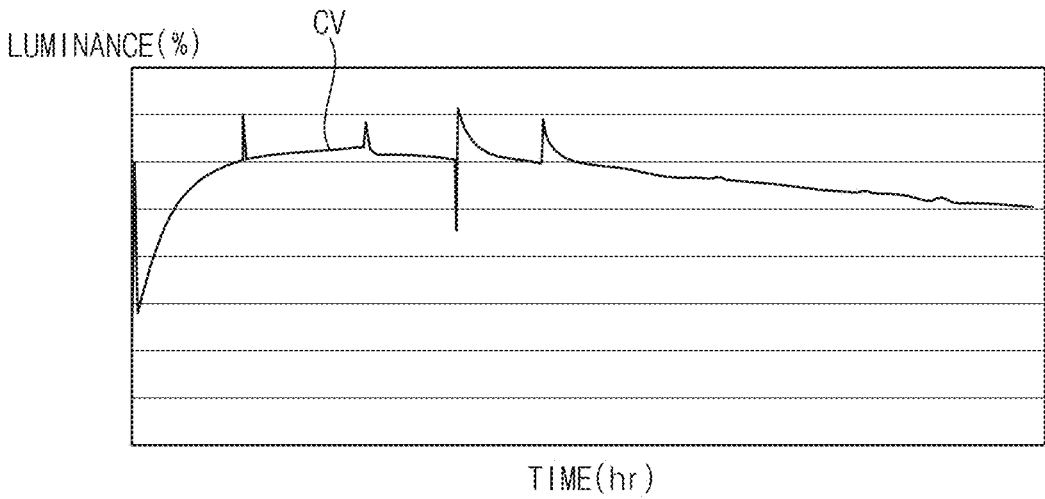
FIG. 8 is a graph illustrating a luminance of a quantum dot light-emitting diode of FIG. 6 according to time in a conventional direct-current driving.
Figure 9:
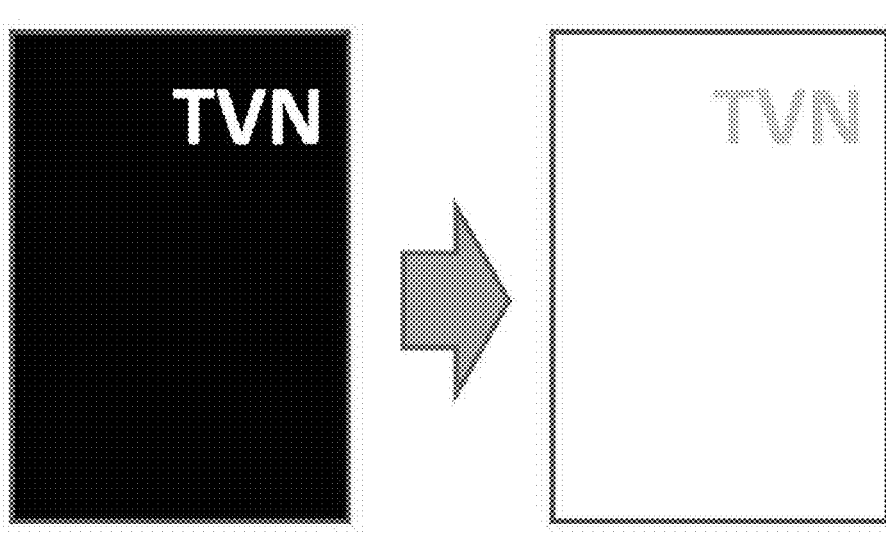
FIG. 9 is a diagram illustrating a display panel having an afterimage stain in a conventional direct-current driving.

FIG. 8 is a graph illustrating a luminance of a quantum dot light-emitting diode EE of FIG. 6 according to time in a conventional direct-current ("DC") driving. FIG. 9 is a diagram illustrating a display panel having an afterimage stain in a conventional DC driving.

Referring to FIGS. 1 to 9, in the quantum dot light-emitting diode, many traps may exist due to a ligand bound to a shell. Initial lifespan characteristics may be reduced due to the traps. In addition, when a state of the display panel 100 is changed from an off-state to an on-state, a hunting may occur and accordingly, an afterimage stain may occur. A reason that the hunting occurs is because a carrier trapped in the trap is released late.

Light may be emitted when electrons (−) and holes (+) combine with each other between a first energy level E1 and a fourth energy level E4 of the light-emitting layer QD of FIG. 7. In contrast, light may not be emitted when the electrons (−) and the holes (+) combine with each other between a second energy level E2 lower than the first energy level E1 and a third energy level E3 higher than the fourth energy level E4 of the light-emitting layer QD of FIG. 7.

In conventional DC driving, the first power ELVDD may have a DC voltage and the second power ELVSS may have a DC voltage. When both of the first power ELVDD and the second power ELVSS have the DC voltage, the electrons may be trapped in the second energy level E2 which is lower than the first energy level E1 and the holes may be trapped in the third energy level E3 which is higher than the fourth energy level E4. When the electrons are trapped in the second energy level E2 and the holes are trapped in the third energy level E3, the light may not be emitted when the electrons (−) and the holes (+) combine with each other.

As shown in CV of FIG. 8, when the state of the display panel 100 is changed from the off-state to the on-state (or when displaying relatively high luminance such as white after displaying relatively low luminance such as black), the display panel 100 may display 100% luminance initially. However, after the on-state begins, the luminance decreases rapidly so that the luminance of the display panel 100 immediately after turn-on may decrease below approximately 85%.

This rapid decrease of the luminance immediately after turn-on is referred to as the hunting. The hunting may be caused by the trap. Immediately after turn-on, a certain number of electrons and holes may be trapped at an inappropriate energy level. After the certain number of electrons and holes are trapped, the luminance may increase again.

FIG. 9 represents the afterimage stain due to the hunting. In an embodiment, when a background portion displays white after displaying black, a state of the white background portion is changed from the off-state to the on-state so that the white background portion may display 100% luminance, for example. In contrast, when a text portion displays white after displaying white, the white text portion may display 85% luminance due to the hunting.

As explained above, a luminance of the portion displaying white after displaying black and a luminance of the portion displaying white after displaying white may be different from each other so that the afterimage stain may occur.

Figure 10:
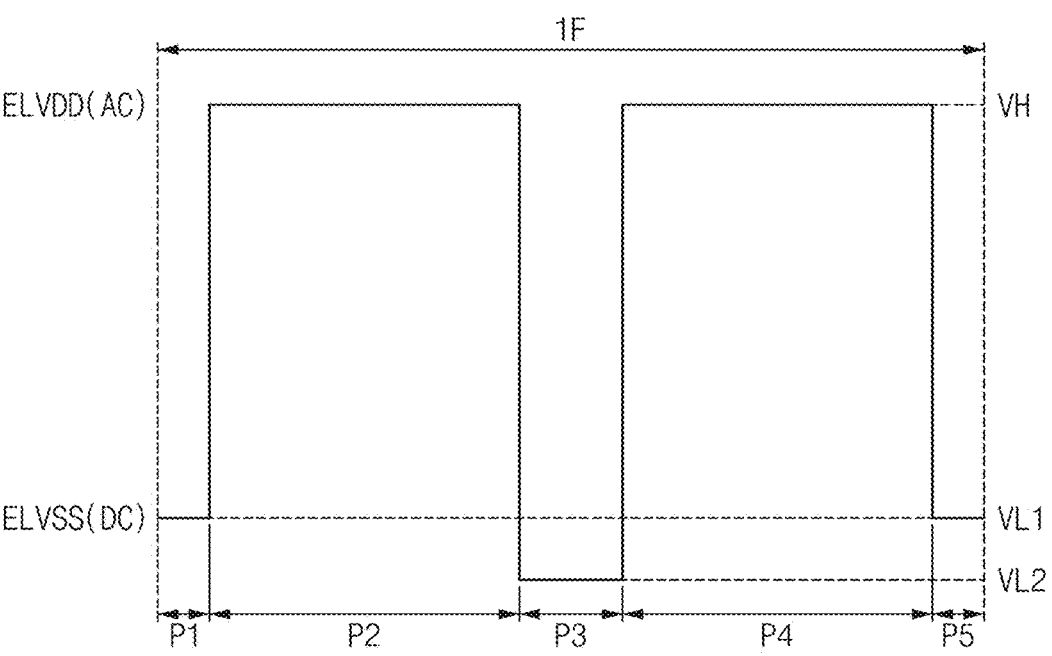
FIG. 10 is a diagram illustrating an embodiment of a first power and a second power which are applied to the pixel of the display panel of FIG. 1.

FIG. 10 is a diagram illustrating an embodiment of the first power ELVDD and the second power ELVSS which are applied to the pixel of the display panel 100 of FIG. 1.

Referring to FIGS. 1 to 10, the quantum dot light-emitting diode EE may be driven by alternating-current ("AC"). In an embodiment, the first power ELVDD and the second power ELVSS are applied to the pixel, one of the first power ELVDD and the second power ELVSS may be an AC power and the other may be a DC power, for example.

In the illustrated embodiment, the first power ELVDD may be the AC power and the second power ELVSS may be the DC power.

In an embodiment, the first power ELVDD may have a high voltage (also referred to as a first voltage) VH, a first low voltage (also referred to as a second voltage) VL1 lower than the high voltage VH and a second low voltage (also referred to as a third voltage) VL2 lower than the first low voltage VL1, for example. The second power ELVSS may have the first low voltage VL1.

A duration when the first power ELVDD has the first low voltage VL1 same as the second power ELVSS may be also referred to as a first off duration. A duration when the first power ELVDD has the second low voltage VL2 lower than the second power ELVSS may be also referred to as a second off duration.

In the first off duration and the second off duration, the quantum dot light-emitting diode EE may be turned off. In the first off duration, the quantum dot light-emitting diode EE may be simply turned off. In the second off duration, a reverse voltage may be applied to the quantum dot light-emitting diode EE so that a trap charge of the light-emitting layer QD of the quantum dot light-emitting diode EE may be removed.

In an embodiment, the first power ELVDD may have a periodicity, for example. When the first power ELVDD has a first period PER1, the second off duration when the first power ELVDD has the second low voltage VL2 may be longer than the first off duration when the first power ELVDD has the first low voltage VL1 in the first period PER1.

In an embodiment, the first power ELVDD may have the first low voltage VL1 in a first duration P1, the first power ELVDD may have the high voltage VH in a second duration P2 subsequent to the first duration P1, the first power ELVDD may have the second low voltage VL2 in a third duration P3 subsequent to the second duration P2, the first power ELVDD may have the high voltage VH in a fourth duration P4 subsequent to the third duration P3 and the first power ELVDD may have the first low voltage VL1 in a fifth duration P5 subsequent to the fourth duration P4, for example.

A length of the third duration P3 may be longer than a sum of a length of the first duration P1 and a length of the fifth duration P5.

In the illustrated embodiment, one of the first power ELVDD and the second power ELVSS which are applied to the pixel may be driven by AC and the other may be driven by DC. When the first power ELVDD is driven by AC, the first power ELVDD may include the high voltage VH, the first low voltage VL1 and the second low voltage VL2 lower than the first low voltage VL1. When the first power ELVDD has the second low voltage VL2, the trapped charge of the light-emitting layer QD of the quantum dot light-emitting diode EE may be removed. Thus, the afterimage stain of the display panel 100 may be prevented and the lifespan of the quantum dot light-emitting diode EE may be enhanced.

Figure 11:
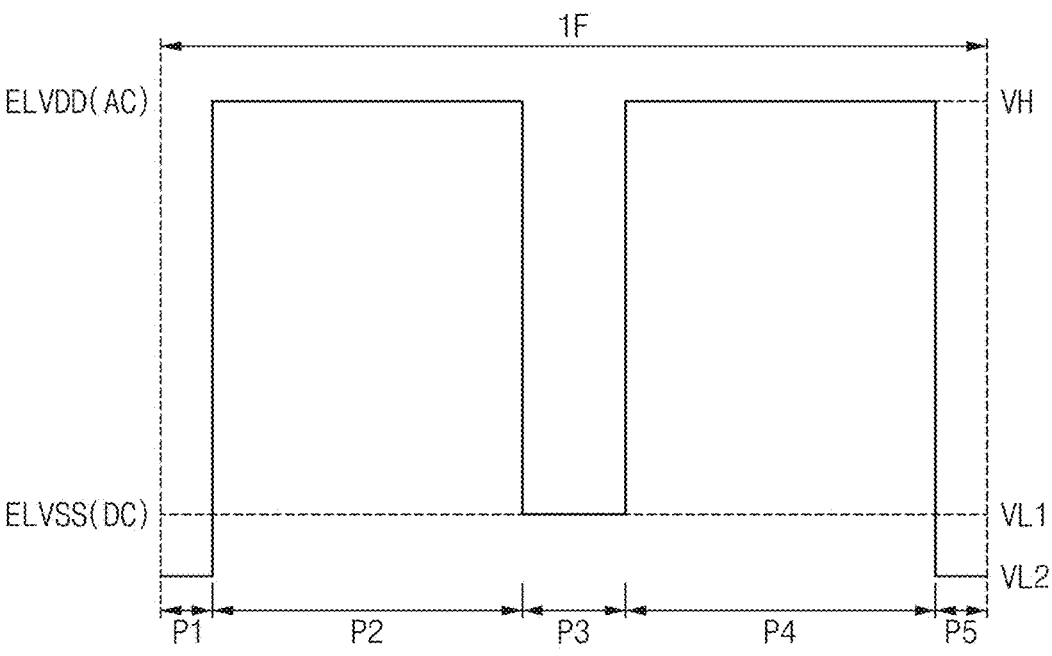
FIG. 11 is a diagram illustrating an embodiment of the first power and the second power which are applied to the pixel of the display panel of FIG. 1.

FIG. 11 is a diagram illustrating an embodiment of the first power ELVDD and the second power ELVSS which are applied to the pixel of the display panel 100 of FIG. 1.

Referring to FIGS. 1 to 9 and 11, the quantum dot light-emitting diode EE may be driven by AC. In an embodiment, the first power ELVDD and the second power ELVSS are applied to the pixel, one of the first power ELVDD and the second power ELVSS may be an AC power and the other may be a DC power, for example.

In the illustrated embodiment, the first power ELVDD may be the AC power and the second power ELVSS may be the DC power.

In an embodiment, the first power ELVDD may have a high voltage VH, a first low voltage VL1 and a second low voltage VL2 lower than the first low voltage VL1, for example. The second power ELVSS may have the first low voltage VL1.

A duration when the first power ELVDD has the first low voltage VL1 same as the second power ELVSS may be also referred to as a first off duration. A duration when the first power ELVDD has the second low voltage VL2 lower than the second power ELVSS may be also referred to as a second off duration.

In the first off duration and the second off duration, the quantum dot light-emitting diode EE may be turned off. In the first off duration, the quantum dot light-emitting diode EE may be simply turned off. In the second off duration, a reverse voltage may be applied to the quantum dot light-emitting diode EE so that a trap charge of the light-emitting layer QD of the quantum dot light-emitting diode EE may be removed.

In an embodiment, the first power ELVDD may have a periodicity, for example. When the first power ELVDD has a first period PER1, the second off duration when the first power ELVDD has the second low voltage VL2 may be longer than the first off duration when the first power ELVDD has the first low voltage VL1 in the first period PER1.

In an embodiment, the first power ELVDD may have the second low voltage VL2 in a first duration P1, the first power ELVDD may have the high voltage VH in a second duration P2 subsequent to the first duration P1, the first power ELVDD may have the first low voltage VL1 in a third duration P3 subsequent to the second duration P2, the first power ELVDD may have the high voltage VH in a fourth duration P4 subsequent to the third duration P3 and the first power ELVDD may have the second low voltage VL2 in a fifth duration P5 subsequent to the fourth duration P4, for example.

A sum of a length of the first duration P1 and a length of the fifth duration P5 may be longer than a length of the third duration P3.

In the illustrated embodiment, one of the first power ELVDD and the second power ELVSS which are applied to the pixel may be driven by AC and the other may be driven by DC. When the first power ELVDD is driven by AC, the first power ELVDD may include the high voltage VH, the first low voltage VL1 and the second low voltage VL2 lower than the first low voltage VL1. When the first power ELVDD has the second low voltage VL2, the trapped charge of the light-emitting layer QD of the quantum dot light-emitting diode EE may be removed. Thus, the afterimage stain of the display panel 100 may be prevented and the lifespan of the quantum dot light-emitting diode EE may be enhanced.

Figure 12:
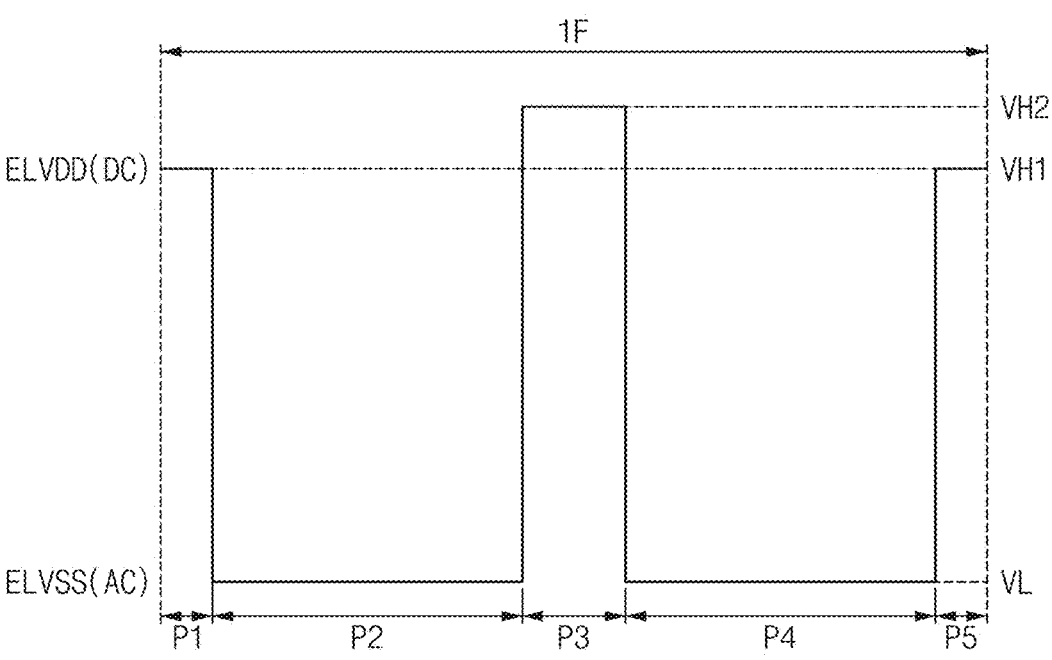
FIG. 12 is a diagram illustrating an embodiment of the first power and the second power which are applied to the pixel of the display panel of FIG. 1.

FIG. 12 is a diagram illustrating an embodiment of the first power ELVDD and the second power ELVSS which are applied to the pixel of the display panel 100 of FIG. 1.

Referring to FIGS. 1 to 9 and 12, the quantum dot light-emitting diode EE may be driven by AC. In an embodiment, the first power ELVDD and the second power ELVSS are applied to the pixel, one of the first power ELVDD and the second power ELVSS may be an AC power and the other may be a DC power, for example.

In the illustrated embodiment, the first power ELVDD may be the DC power and the second power ELVSS may be the AC power.

In an embodiment, the second power ELVSS may have a low voltage (also referred to as a first voltage) VL, a first high voltage (also referred to as a second volage) VH1 higher than the low voltage VL and a second high voltage (also referred to as a third volage) VH2 higher than the first high voltage VH1, for example. The first power ELVDD may have the first high voltage VH1.

A duration when the second power ELVSS has the first high voltage VH1 same as the first power ELVDD may be also referred to as a first off duration. A duration when the second power ELVSS has the second high voltage VH2 higher than the first power ELVDD may be also referred to as a second off duration.

In the first off duration and the second off duration, the quantum dot light-emitting diode EE may be turned off. In the first off duration, the quantum dot light-emitting diode EE may be simply turned off. In the second off duration, a reverse voltage may be applied to the quantum dot light-emitting diode EE so that a trap charge of the light-emitting layer QD of the quantum dot light-emitting diode EE may be removed.

In an embodiment, the second power ELVSS may have a periodicity, for example. When the second power ELVSS has a first period PER1, the second off duration when the second power ELVSS has the second high voltage VH2 may be longer than the first off duration when the second power ELVSS has the first high voltage VH1 in the first period PER1.

In an embodiment, the second power ELVSS may have the first high voltage VH1 in a first duration P1, the second power ELVSS may have the low voltage VL in a second duration P2 subsequent to the first duration P1, the second power ELVSS may have the second high voltage VH2 in a third duration P3 subsequent to the second duration P2, the second power ELVSS may have the low voltage VL in a fourth duration P4 subsequent to the third duration P3 and the second power ELVSS may have the first high voltage VH1 in a fifth duration P5 subsequent to the fourth duration P4, for example.

A length of the third duration P3 may be longer than a sum of a length of the first duration P1 and a length of the fifth duration P5.

In the illustrated embodiment, one of the first power ELVDD and the second power ELVSS which are applied to the pixel may be driven by AC and the other may be driven by DC. When the second power ELVSS is driven by AC, the second power ELVSS may include the low voltage VL, the first high voltage VH1 and the second high voltage VH2 higher than the first high voltage VH1. When the second power ELVSS has the second high voltage VH2, the trapped charge of the light-emitting layer QD of the quantum dot light-emitting diode EE may be removed. Thus, the after-image stain of the display panel 100 may be prevented and the lifespan of the quantum dot light-emitting diode EE may be enhanced.

Figure 13:
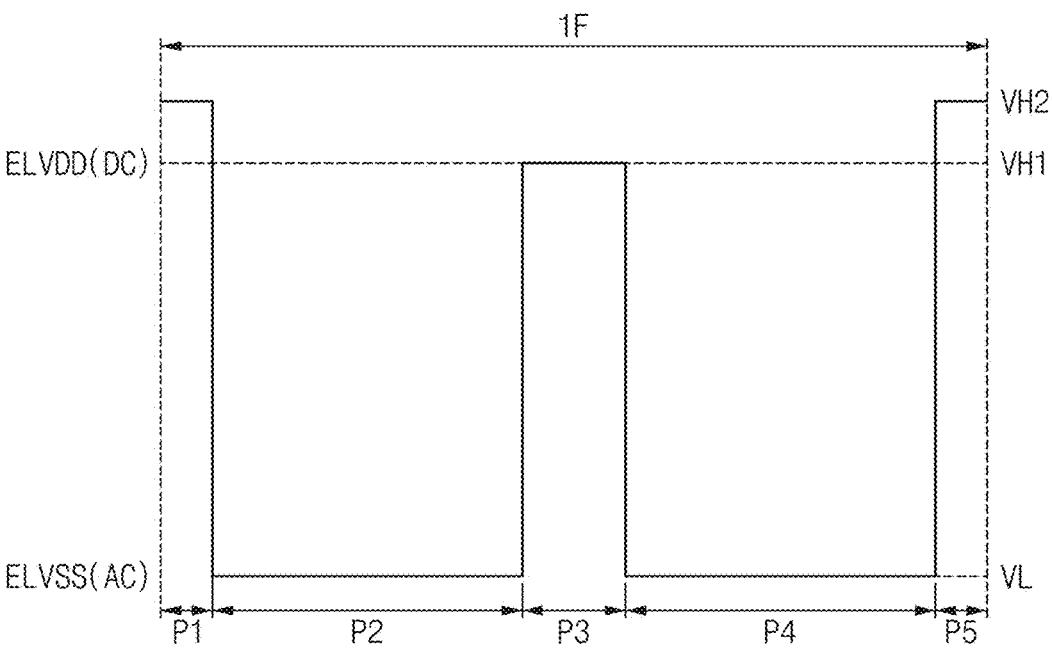
FIG. 13 is a diagram illustrating an embodiment of the first power and the second power which are applied to the pixel of the display panel of FIG. 1.

FIG. 13 is a diagram illustrating an embodiment of the first power ELVDD and the second power ELVSS which are applied to the pixel of the display panel 100 of FIG. 1.

Referring to FIGS. 1 to 9 and 13, the quantum dot light-emitting diode EE may be driven by AC. In an embodiment, the first power ELVDD and the second power ELVSS are applied to the pixel, one of the first power ELVDD and the second power ELVSS may be an AC power and the other may be a DC power, for example.

In the illustrated embodiment, the first power ELVDD may be the DC power and the second power ELVSS may be the AC power.

In an embodiment, the second power ELVSS may have a low voltage VL, a first high voltage VH1 and a second high voltage VH2 higher than the first high voltage VH1. The first power ELVDD may have the first high voltage VH1, for example.

A duration when the second power ELVSS has the first high voltage VH1 same as the first power ELVDD may be also referred to as a first off duration. A duration when the second power ELVSS has the second high voltage VH2 higher than the first power ELVDD may be also referred to as a second off duration.

In the first off duration and the second off duration, the quantum dot light-emitting diode EE may be turned off. In the first off duration, the quantum dot light-emitting diode EE may be simply turned off. In the second off duration, a reverse voltage may be applied to the quantum dot light-emitting diode EE so that a trap charge of the light-emitting layer QD of the quantum dot light-emitting diode EE may be removed.

In an embodiment, the second power ELVSS may have a periodicity, for example. When the second power ELVSS has a first period PER1, the second off duration when the second power ELVSS has the second high voltage VH2 may be longer than the first off duration when the second power ELVSS has the first high voltage VH1 in the first period PER1.

In an embodiment, the second power ELVSS may have the second high voltage VH2 in a first duration P1, the second power ELVSS may have the low voltage VL in a second duration P2 subsequent to the first duration P1, the second power ELVSS may have the first high voltage VH1 in a third duration P3 subsequent to the second duration P2, the second power ELVSS may have the low voltage VL in a fourth duration P4 subsequent to the third duration P3 and the second power ELVSS may have the second high voltage VH2 in a fifth duration P5 subsequent to the fourth duration P4, for example.

A sum of a length of the first duration P1 and a length of the fifth duration P5 may be longer than a length of the third duration P3.

In the illustrated embodiment, one of the first power ELVDD and the second power ELVSS which are applied to the pixel may be driven by AC and the other may be driven by DC. When the second power ELVSS is driven by AC, the second power ELVSS may include the low voltage VL, the first high voltage VH1 and the second high voltage VH2 higher than the first high voltage VH1. When the second power ELVSS has the second high voltage VH2, the trapped charge of the light-emitting layer QD of the quantum dot light-emitting diode EE may be removed. Thus, the after-image stain of the display panel 100 may be prevented and the lifespan of the quantum dot light-emitting diode EE may be enhanced.

Figure 14:
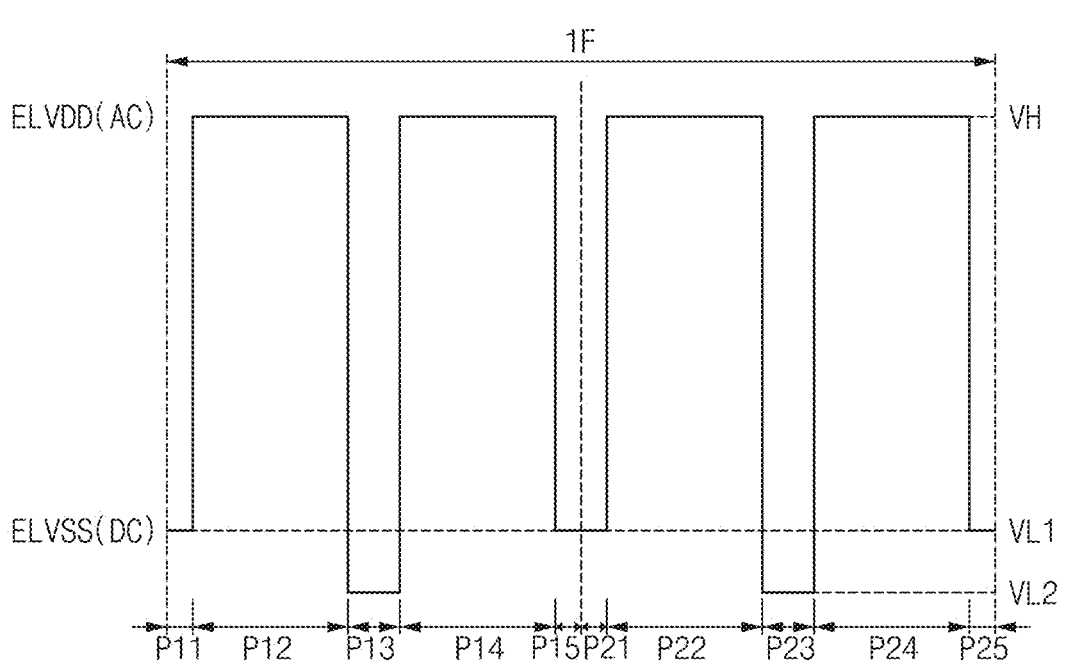
FIG. 14 is a diagram illustrating an embodiment of the first power and the second power which are applied to the pixel of the display panel of FIG. 1.

FIG. 14 is a diagram illustrating an embodiment of the first power ELVDD and the second power ELVSS which are applied to the pixel of the display panel 100 of FIG. 1.

In FIGS. 10 to 13, the AC power may have a periodicity of the first period PER1. In FIGS. 10 to 13, for example, one period of the first period PER1 may be disposed in a single driving frame 1F of the display panel 100.

In FIG. 14, the AC power may have a periodicity of a second period PER2. A plurality of periods of the second period PER2 may be disposed in a single driving frame 1F of the display panel 100. In FIG. 14, the first power ELVDD may be the AC power and two waveforms of two sub-periods (i.e., one sub-period consisting of durations P11, P12, P13, P14, P15 and another sub-period consisting of durations P21, P22, P23, P24 and P25) of the second period PER2 may be disposed in a single driving frame 1F of the display panel 100.

Referring to FIG. 14, the first power ELVDD may have the first low voltage VL1 in a first duration P11, the first power ELVDD may have the high voltage VH in a second duration P12 subsequent to the first duration P11, the first power ELVDD may have the second low voltage VL2 in a third duration P13 subsequent to the second duration P12, the first power ELVDD may have the high voltage VH in a fourth duration P14 subsequent to the third duration P13, the first power ELVDD may have the first low voltage VL1 in a fifth duration P15 subsequent to the fourth duration P14, the first power ELVDD may have the first low voltage VL1 in a sixth duration P21 subsequent to the fifth duration P15, the first power ELVDD may have the high voltage VH in a seventh duration P22 subsequent to the sixth duration P21, the first power ELVDD may have the second low voltage VL2 in an eighth duration P23 subsequent to the seventh duration P22, the first power ELVDD may have the high voltage VH in a ninth duration P24 subsequent to the eighth duration P23 and the first power ELVDD may have the first low voltage VL1 in a tenth duration P25 subsequent to the ninth duration P24.

In FIG. 14, a plurality of waveforms of FIG. 10 may be disposed in the single driving frame 1F. In an alternative embodiment, a plurality of waveforms of FIG. 11 may be disposed in the single driving frame 1F, a plurality of waveforms of FIG. 12 may be disposed in the single driving frame 1F and a plurality of waveforms of FIG. 13 may be disposed in the single driving frame 1F.

Figure 15:
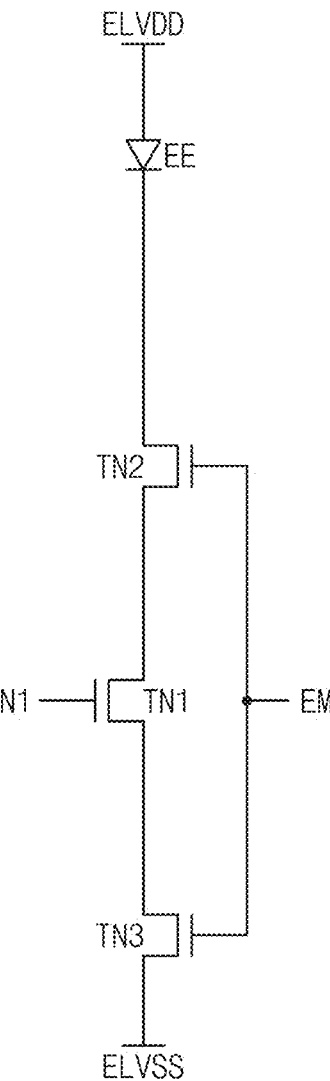
FIG. 15 is a circuit diagram illustrating an embodiment of a portion of a pixel of a display panel according to the inventive concept.

FIG. 15 is a circuit diagram illustrating an embodiment of a portion of a pixel of a display panel according to the inventive concept.

FIG. 15 represents a portion of a pixel circuit having a reverse structure in which the quantum dot light-emitting diode EE is connected to the first power ELVDD.

Referring to FIG. 15, the first power ELVDD may be applied to the quantum dot light-emitting diode EE and the second power ELVSS may applied to a third N transistor TN3.

Between the first power ELVDD and the second power ELVSS, the quantum dot light-emitting diode EE, a second N transistor TN2, a first N transistor TN1 and the third N transistor TN3 are sequentially disposed. The pixel circuit of the inventive concept is not limited to the pixel circuit of FIG. 2 and the pixel circuit of FIG. 3. The inventive concept may be applied to various pixels in which one or more switching element and the quantum dot light-emitting diode EE are disposed between the first power ELVDD and the second power ELVSS like FIG. 15.

Figure 16:
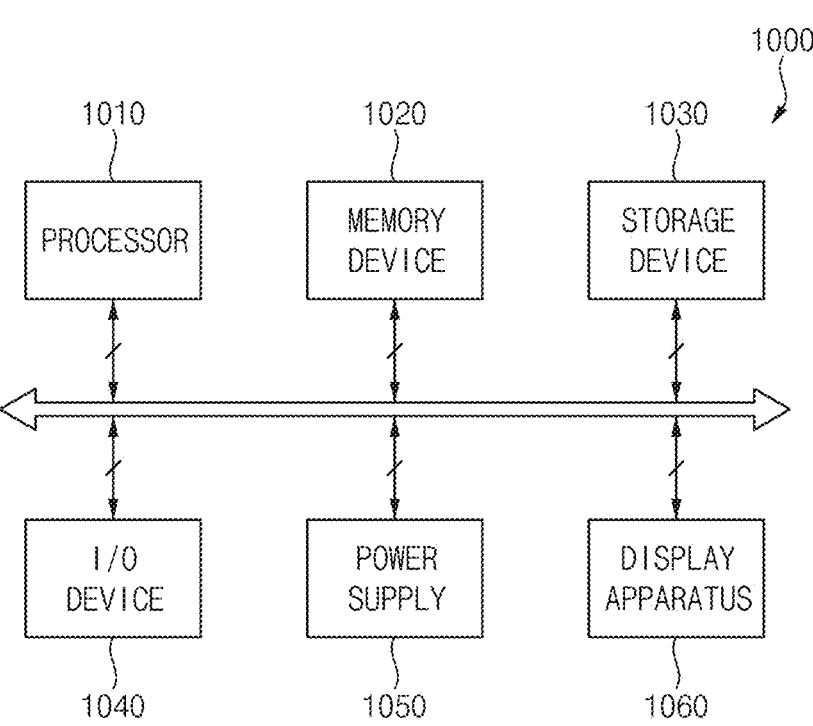
FIG. 16 is a block diagram illustrating an embodiment of an electronic apparatus according to the inventive concept.
Figure 17:
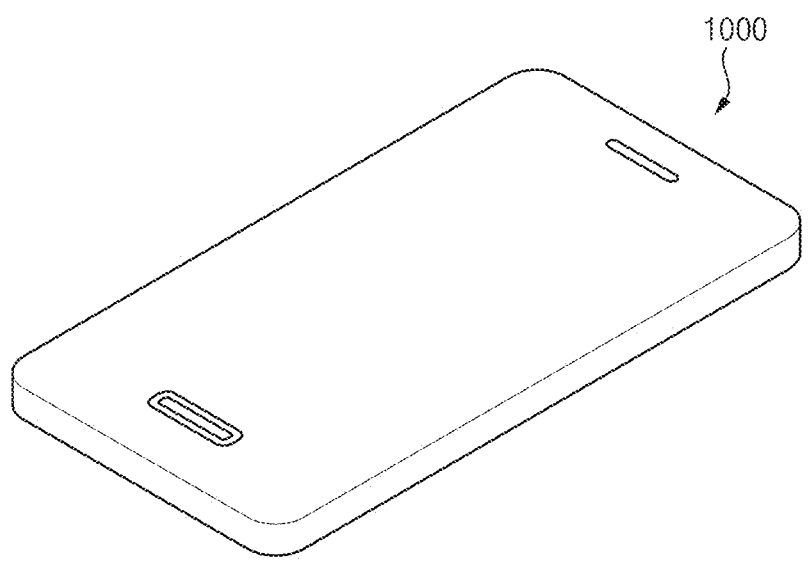
FIG. 17 is a diagram illustrating an embodiment in which the electronic apparatus of FIG. 16 is implemented as a smart phone.

FIG. 16 is a block diagram illustrating an embodiment of an electronic apparatus according to the inventive concept. FIG. 17 is a diagram illustrating an embodiment in which the electronic apparatus of FIG. 16 is implemented as a smart phone.

Referring to FIGS. 1 to 17, the electronic apparatus 1000 may include a processor 1010, a memory device 1020, a storage device 1030, an input/output ("I/O") device 1040, a power supply 1050 and a display apparatus 1060. Here, the display apparatus 1060 may be the display apparatus of FIG. 1. In addition, the electronic apparatus 1000 may further include a plurality of ports for communicating with a video card, a sound card, a memory card, a universal serial bus ("USB") device, other electronic apparatuses, etc.

In an embodiment, as illustrated in FIG. 17, the electronic apparatus 1000 may be implemented as a smart phone. However, the electronic apparatus 1000 is not limited thereto. In an embodiment, the electronic apparatus 1000 may be implemented as a cellular phone, a video phone, a smart pad, a smart watch, a tablet personal computer ("PC"), a car navigation system, a computer monitor, a laptop, a head mounted display ("HMD") device, or the like, for example.

The processor 1010 may perform various computing functions or various tasks. The processor 1010 may be a micro-processor, a central processing unit ("CPU"), an application processor ("AP"), or the like. The processor 1010 may be coupled to other components via an address bus, a control bus, a data bus, etc. Further, the processor 1010 may be coupled to an extended bus such as a peripheral component interconnection ("PCI") bus.

The processor 1010 may output the input image data IMG and the input control signal CONT to the driving controller 200 of FIG. 1.

The memory device 1020 may store data for operations of the electronic apparatus 1000. In an embodiment, the memory device 1020 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like and/or at least one volatile memory device such as a dynamic random access memory ("DRAM") device, a static random access memory ("SRAM") device, a mobile DRAM device, or the like, for example.

The storage device 1030 may include a solid state drive ("SSD") device, a hard disk drive ("HDD") device, a compact disc read-only memory ("CD-ROM") device, or the like. The I/O device 1040 may include an input device such as a keyboard, a keypad, a mouse device, a touch-pad, a touch-screen, or the like and an output device such as a printer, a speaker, or the like. In some embodiments, the display apparatus 1060 may be included in the I/O device 1040. The power supply 1050 may provide power for operations of the electronic apparatus 1000. The display apparatus 1060 may be coupled to other components via the buses or other communication links.

According to the display panel and the method of driving the display panel of the illustrated embodiment as explained above, the display quality of the display panel may be enhanced and the lifespan of the quantum dot light-emitting diode may be enhanced.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the predetermined embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. An electronic device comprising:
a display panel comprising:
a pixel including a quantum dot light-emitting diode,
wherein a first power and a second power are applied to an anode electrode of the quantum dot light-emitting diode and a cathode electrode of the quantum dot light-emitting diode of the pixel, respectively,
wherein one of the first power and the second power is an alternating-current power and a remaining one of the first power and the second power is a direct-current power, and
wherein the alternating-current power which is the one of the first power and the second power has three different voltage levels.

2. The electronic device of claim 1, wherein the first power is the alternating-current power, and wherein the first power has a first voltage, a second voltage lower than the first voltage and a third voltage lower than the second voltage.

3. The electronic device of claim 2, wherein the second power is the direct-current power, and wherein the second power has the second voltage.

4. The electronic device of claim 2, wherein the first power has a periodicity of a first period, wherein a second off duration when the first power has the third voltage is longer than a first off duration when the first power has the second voltage in the first period.

5. The electronic device of claim 2, wherein the first power has the second voltage in a first duration, wherein the first power has the first voltage in a second duration subsequent to the first duration, wherein the first power has the third voltage in a third duration subsequent to the second duration, wherein the first power has the first voltage in a fourth duration subsequent to the third duration, and wherein the first power has the second voltage in a fifth duration subsequent to the fourth duration.

6. The electronic device of claim 5, wherein a length of the third duration is longer than a sum of a length of the first duration and a length of the fifth duration.

7. The electronic device of claim 2, wherein the first power has the third voltage in a first duration, wherein the first power has the first voltage in a second duration subsequent to the first duration, wherein the first power has the second voltage in a third duration subsequent to the second duration, wherein the first power has the first voltage in a fourth duration subsequent to the third duration, and wherein the first power has the third voltage in a fifth duration subsequent to the fourth duration.

8. The electronic device of claim 7, wherein a sum of a length of the first duration and a length of the fifth duration is longer than a length of the third duration.

9. The electronic device of claim 1, wherein the second power is the alternating-current power, and wherein the second power has a first voltage, a second voltage higher than the first voltage and a third voltage higher than the second voltage.

10. The electronic device of claim 9, wherein the first power is the direct-current power, and wherein the first power has the second voltage.

11. The electronic device of claim 9, wherein the second power has a periodicity of a first period, and wherein a second off duration when the second power has the third voltage is longer than a first off duration when the second power has the second voltage in the first period.

12. The electronic device of claim 9, wherein the second power has the second voltage in a first duration, wherein the second power has the first voltage in a second duration subsequent to the first duration, wherein the second power has the third voltage in a third duration subsequent to the second duration, wherein the second power has the first voltage in a fourth duration subsequent to the third duration, and wherein the second power has the second voltage in a fifth duration subsequent to the fourth duration.

13. The electronic device of claim 9, wherein the second power has the third voltage in a first duration, wherein the second power has the first voltage in a second duration subsequent to the first duration, wherein the second power has the second voltage in a third duration subsequent to the second duration, wherein the second power has the first voltage in a fourth duration subsequent to the third duration, and wherein the second power has the third voltage in a fifth duration subsequent to the fourth duration.

14. The electronic device of claim 1, wherein the alternating-current power has a periodicity of a first period, and wherein one period of the first period is disposed in a single driving frame of the electronic device.

15. The electronic device of claim 1, wherein the alternating-current power has a periodicity of a first period, and wherein a plurality of sub-periods of the first period is disposed in a single driving frame of the electronic device.

16. The electronic device of claim 15, wherein the first power is the alternating-current power, wherein the first power has a first voltage, a second voltage lower than the first voltage and a third voltage lower than the second voltage, wherein the first power has the second voltage in a first duration, wherein the first power has the first voltage in a second duration subsequent to the first duration, wherein the first power has the third voltage in a third duration subsequent to the second duration, wherein the first power has the first voltage in a fourth duration subsequent to the third duration, wherein the first power has the second voltage in a fifth duration subsequent to the fourth duration, wherein the first power has the second voltage in a sixth duration subsequent to the fifth duration, wherein the first power has the first voltage in a seventh duration subsequent to the sixth duration, wherein the first power has the third voltage in an eighth duration subsequent to the seventh duration, wherein the first power has the first voltage in a ninth duration subsequent to the eighth duration, and wherein the first power has the second voltage in a tenth duration subsequent to the ninth duration.

17. The electronic device of claim 1, wherein the quantum dot light-emitting diode comprises:

a hole injection layer;

a hole transporting layer adjacent to the hole injection layer;

a light-emitting layer adjacent to the hole transporting layer; and an electron transporting layer adjacent to the light-emitting layer, wherein the hole injection layer and the hole transporting layer include an organic material, wherein the light-emitting layer and the electron transporting layer include an inorganic material, and wherein the light-emitting layer includes a quantum dot.

18. The electronic device of claim 1, wherein the pixel comprises:

a first pixel switching element including a control electrode connected to a first node, a first electrode connected to a second node and a second electrode connected to a third node;

a second pixel switching element including a control electrode which receives a data writing gate signal, a first electrode which receives a data voltage and a second electrode connected to the second node;

a third pixel switching element including a control electrode which receives the data writing gate signal, a first electrode connected to the first node and a second electrode connected to the third node;

a fourth pixel switching element including a control electrode which receives a data initialization gate signal, a first electrode which receives an initialization voltage and a second electrode connected to the first node;

a fifth pixel switching element including a control electrode which receives an emission signal, a first electrode which receives the first power and a second electrode connected to the second node;

a sixth pixel switching element including a control electrode which receives the emission signal, a first electrode connected to the third node and a second electrode connected to the anode electrode of the quantum dot light-emitting diode; and a seventh pixel switching element including a control electrode which receives a light-emitting diode initialization gate signal, a first electrode which receives a light-emitting diode initialization voltage and a second electrode connected to the anode electrode of the quantum dot light-emitting diode, and wherein the second power is applied to the cathode electrode of the quantum dot light-emitting diode.

19. The electronic device of claim 18, wherein the third pixel switching element includes a 3-1 transistor and a 3-2 transistor connected to each other in series, wherein the fourth pixel switching element includes a 4-1 transistor and a 4-2 transistor connected to each other in series, and wherein the pixel further comprises:

a first capacitor including a first electrode which receives the first power and a second electrode connected to the first node;

a second capacitor including a first electrode which receives the first power and a second electrode connected to a first intermediate node between the 3-1 transistor and the 3-2 transistor; and a third capacitor including a first electrode which receives the first power and a second electrode connected to a second intermediate node between the 4-1 transistor and the 4-2 transistor.

20. A method of driving an electronic device comprising a display panel, the method comprising:

applying a first power to an anode electrode of a quantum dot light-emitting diode of a pixel; and applying a second power to a cathode electrode of the quantum dot light-emitting diode of the pixel, wherein one of the first power and the second power is an alternating-current power and a remaining one of the first power and the second power is a direct-current power, and wherein the alternating-current power which is the one of the first power and the second power has three different voltage levels.

* * * * *